(12) United States Patent
Reeves

(10) Patent No.: US 11,211,666 B2
(45) Date of Patent: Dec. 28, 2021

(54) VEHICLE BATTERY PACK AND BATTERY EXCHANGE SYSTEM

(71) Applicant: Goodwyn George Reeves, Raleigh, NC (US)

(72) Inventor: Goodwyn George Reeves, Raleigh, NC (US)

(73) Assignee: Goodwyn George Reeves, Raleigh, NC (US)

( * ) Notice: Subject to any disclaimer, the term of this patent is extended or adjusted under 35 U.S.C. 154(b) by 0 days.

(21) Appl. No.: 17/110,847

(22) Filed: Dec. 3, 2020

(65) Prior Publication Data

US 2021/0091439 A1     Mar. 25, 2021

Related U.S. Application Data

(63) Continuation-in-part of application No. 16/677,456, filed on Nov. 7, 2019, now abandoned.
(Continued)

(51) Int. Cl.
*H01M 50/269*    (2021.01)
*H01M 10/42*    (2006.01)
(Continued)

(52) U.S. Cl.
CPC ........... *H01M 50/269* (2021.01); *B60L 53/30* (2019.02); *B60L 53/665* (2019.02); *B60L 53/80* (2019.02); *B60L 58/18* (2019.02); *G01R 31/392* (2019.01); *H01M 10/4285* (2013.01); *H01M 50/204* (2021.01); *H01M 50/249* (2021.01); *H01M 50/284* (2021.01); *H01M 2220/20* (2013.01)

(58) Field of Classification Search
None
See application file for complete search history.

(56) References Cited

U.S. PATENT DOCUMENTS

2010/0145717 A1*    6/2010   Hoeltzel ................. B60L 50/66
                                                                                          705/1.1
2010/0287078 A1*   11/2010   Graehn ................. B60L 53/305
                                                                                           705/34

(Continued)

*Primary Examiner* — David V Henze-Gongola
(74) *Attorney, Agent, or Firm* — Coats & Bennett, PLLC

(57) ABSTRACT

The vehicle battery pack exchange system herein described charges renters for the time use interval, the energy needed to recharge the battery pack, and the battery wear their use has caused. Data on battery wear accelerating stress parameters such as current, voltage, temperature, and state of charge is collected for battery packs rented to vehicle users. Wear rates are estimated from the collected data. Then either users are charged for the wear they cause or wear is limited to some predetermined wear rate and users are charged a predetermined battery wear fee per kWh delivered by the battery pack. In either embodiment drivers are displayed information to adapt their driving to battery wear rates. Renters are charged for battery pack usage time, energy supplied by the rental station, and battery wear providing battery owners a secure return on their investment. This system accommodates both short term and sustained long term rentals. Long term rental of a single battery pack for local use gives convenience and low costs while short term rentals provide unlimited range via swapping exhausted packs for recharged units during extended travel.

8 Claims, 7 Drawing Sheets

Related U.S. Application Data

(60) Provisional application No. 62/880,296, filed on Jul. 30, 2019.

(51) Int. Cl.
*H01M 50/204* (2021.01)
*H01M 50/249* (2021.01)
*H01M 50/284* (2021.01)
*B60L 53/80* (2019.01)
*B60L 53/30* (2019.01)
*B60L 53/66* (2019.01)
*B60L 58/18* (2019.01)
*G01R 31/392* (2019.01)

(56) References Cited

U.S. PATENT DOCUMENTS

2012/0271723 A1* 10/2012 Penilla ................. B60L 53/305
  705/16
2016/0232736 A1* 8/2016 Holtappels ........ H01M 10/4221

* cited by examiner

VEHICLE BATTERY PACK AND BATTERY EXCHANGE SYSTEM

RELATED APPLICATIONS

The present application is a continuation-in-part of U.S. patent application Ser. No. 16/677,342, which was filed on Nov. 7, 2019, which application claims benefit of U.S. Provisional Application 62/880,296, which was filed Jul. 30, 2019, the disclosures of each of which are incorporated herein by reference in their entirety.

TECHNICAL FIELD

The present disclosure relates generally to batteries for electric vehicles and, more particularly, to a vehicle battery pack designed for use in a battery exchange system.

BACKGROUND

The electric vehicle industry can greatly benefit from battery pack rental because it reduces initial purchase cost significantly and eliminates the battery range problem. Many drivers away from congested cities consider 10 hours at 70 MPH a normal day's drive on a long trip. Indeed, sufficient battery range is essential since consumers are reluctant to purchase vehicles which do not have enough range to complete day long trips. There are only two known ways to deliver the battery range consumers demand. Either large batteries can be rapidly recharged or used battery packs can be swapped for recharged packs to get rapidly back on the road. Future developments in battery technology may enable large inexpensive batteries with sufficient capacity to permit 800 mile day long driving with overnight recharges. Despite over a century of research and development, such batteries do not yet exist. Even if battery technology improves enough to allow 800 mile battery range, overnight recharging overnight is likely to remain a problem because the batteries would be very large. A 250 kWh battery would need a 25 kW charger for a 10 hour overnight charge. Many travel destinations do not have this much extra electrical capacity.

The fast recharge battery solution also suffers from several difficulties. Each vehicle must be sold with a large battery sufficient for about 300 miles travel between recharge points for occasional long distance travel making purchase prices higher. The battery cost and durability will be compromised by the need to be recharged in about 10 minutes. The fast recharge process places enormous demands on the electric power grid. A single 100 kWh battery fully recharging in 10 minutes needs 600 kW of power. A single highway recharging business with 10 recharging stations would demand 6000 kW which is approximately the demand of a small city. The peak power demand costs will have to be paid by highway drivers through increased fees for recharging. Thus, owners of battery powered vehicles would face high initial purchase costs for large batteries and premium charges for fast highway recharging.

Battery swapping solutions provide an alternative to recharging solutions. Instead of purchasing batteries as part of the vehicle, customers lease or rent batteries, which can be exchanged at battery exchange stations when the batteries are depleted. Battery swapping solutions can be used as part of a battery exchange system. In conventional battery exchange systems, the customer is charged a rental fee based on the amount of energy used and the length of the rental period.

A problem in prior art battery exchange systems is the inability to accurately track battery wear during the useful life of the battery. This inability to account for battery wear remains an obstacle to widespread adoption of battery exchange systems. Every kilowatt hour stored and withdrawn from a battery causes some battery wear because the chemical constituents do not all always return to their original configuration after a charge-discharge cycle. The wear rate is highly dependent on how the battery is used. Temperature, state of charge, and charge and discharge current levels are all known to effect battery wear rates by as much as a factor of ten or more. Use is under the control of the battery renter while the cost of wear is born by the battery owner. Battery renting is a risky venture unless the variable cost of wear can be accounted for.

Accordingly, there remains a need for further improvements in battery swapping solutions that allow the battery owners to track and account for battery wear.

SUMMARY

The present disclosure provides methods and apparatus that allow battery owners to track and account for battery wear. The methods and apparatus described herein can be implemented as part of a battery exchange system. Additionally, the methods and apparatus herein described enable the battery owners to control battery wear by restricting usage patterns that result in higher than normal battery wear.

One aspect of the disclosure comprises a battery pack that is specifically designed to track and record stress parameters that are indicative of battery wear such as state of charge, voltage, current levels, and temperature. The stress parameters can be used to determine an amount of battery wear or a battery wear rate occurring during a specific rental period.

In some embodiments, the amount of battery wear or battery wear rate is used to determine a variable component of the rental fee attributable to battery wear incurred during the rental period. Battery wear costs are determined from measured and recorded wear accelerating stress parameters and can be allocated to users according to the amount of wear caused by the individual users.

In other embodiments, the amount of battery wear or battery wear rate can be used to limit or restrict high wear rate conditions to extend the useful life of the battery. For example, a cap can be placed on the amount of current that can be used under high wear rate conditions. High wear rate conditions can be prohibited once the cap is reached.

Another aspect of the disclosure comprises a battery exchange system using the replaceable battery pack as herein described. The replaceable battery pack comprises a plurality of electrochemical cells bundled in a swappable module that can be quickly replaced when the charge is depleted. Owners can lease a small battery pack for normal daily driving and recharge the battery pack overnight at home. Recharged battery packs can be rented for longer trips and replaced quickly during the day with recharged battery packs at battery swap stations located along the highways. The battery pack includes a monitoring system and controls for monitoring parameters related to usage and wear of the battery pack. The energy consumption and battery wear costs during the rental period are estimated and charged to the renter of said battery pack.

The battery pack and battery exchange system enable virtually unlimited range for owners of electric vehicles.

Further, there is no need to compromise battery cost and durability to achieve fast recharge. Battery pack recharging can be used to level power grid peak loads. Emptied battery packs can be recharged at off peak times. The potential off peak load produced by switching vehicles from fossil fuel to battery power is about ⅓ of total generation in 2017. A further benefit to the power grid is that discharged battery packs will start to appear when travelers start refueling in late morning hours when solar electricity generation begins to peak providing a convenient storage for surplus solar or wind electricity on the power grid.

Rented battery packs make it unnecessary for consumers to pay for the battery when they buy an electric vehicle. Vehicle cost and sales price is reduced by eliminating the fuel fired engine, fuel system, exhaust system, and pollution controls while substituting an electric motor and its controls for the automatic transmission and its controls. Thus, consumers would enjoy the quiet, performance, and convenience of an electric vehicle at lower initial purchase prices than current fuel powered vehicles. No longer would they face a hot parked car in summer or have to wait for engine heat in winter. Neither would they have to get their hands dirty pumping fuel, wait for an oil change, or pay for engine maintenance, timing belt replacements, and ignition tune-ups. A significant market switch from fuel powered to electric powered vehicles can be expected to produce a fuel glut and resulting very low fuel prices. Even if fuel power is lower cost than electric power, electric power can be expected to dominate with its lower initial vehicle purchase prices, higher performance, comfort, and convenience because neither energy cost will be very large and important to consumers. Even if fuel is free cars powered by rented swappable batteries are still likely to enjoy a cost per mile advantage due to their lower initial purchase price, lower maintenance expense, and absence of an engine or permanent battery to wear out.

A further advantage of rented battery packs is that users without access to chargers can still enjoy the advantages of battery power by simply swapping battery packs as they are depleted.

Rented standardized battery packs for trucks also facilitate system deployment. Since 18 wheeler trucks can also be propelled by battery packs, a nationwide battery swap system using highway truck stops would be attractive. The system would need hundreds of swap stations instead of the millions of chargers needed by non-swappable batteries. Trucking is very cost sensitive and the lower costs associated with rented battery propulsion would drive fast system deployment. Once the national truck system is in place, personal automobiles and small trucks would automatically have a national battery swap system for use on long trips.

Another advantage of using the same battery packs for both commercial and personal vehicles is improved rental load factor. Personal long trip use tends to peak during holiday times when commercial use is lower. Excess packs to handle peak vacation travel can be rented to commercial users during non-vacation times. Battery packs not producing rental revenue can be used for utility load leveling to save available off peak or intermittent renewable energy for later use when it is needed. Owners of rental batteries and swap stations would thus enjoy three distinct revenue sources from personal vehicle battery rental, commercial vehicle battery rental, and utility load leveling service fees.

In some embodiments, users of the battery exchange system can select between a fixed battery wear cost or variable battery wear cost option for determining battery wear costs. The fixed cost option limits battery current in high wear situations and keeps wear within some predictable average level with a corresponding average wear charge per kWh. The variable cost approach tracks and records stress parameters that are indicative of battery wear during the rental period and computes battery wear costs based on the stress parameters. The average and instantaneous battery wear rates can be displayed to the driver when the variable cost approach is selected. The variable cost option provides some measure of control to the user over the battery wear costs.

DETAILED DESCRIPTION

Figure 1:
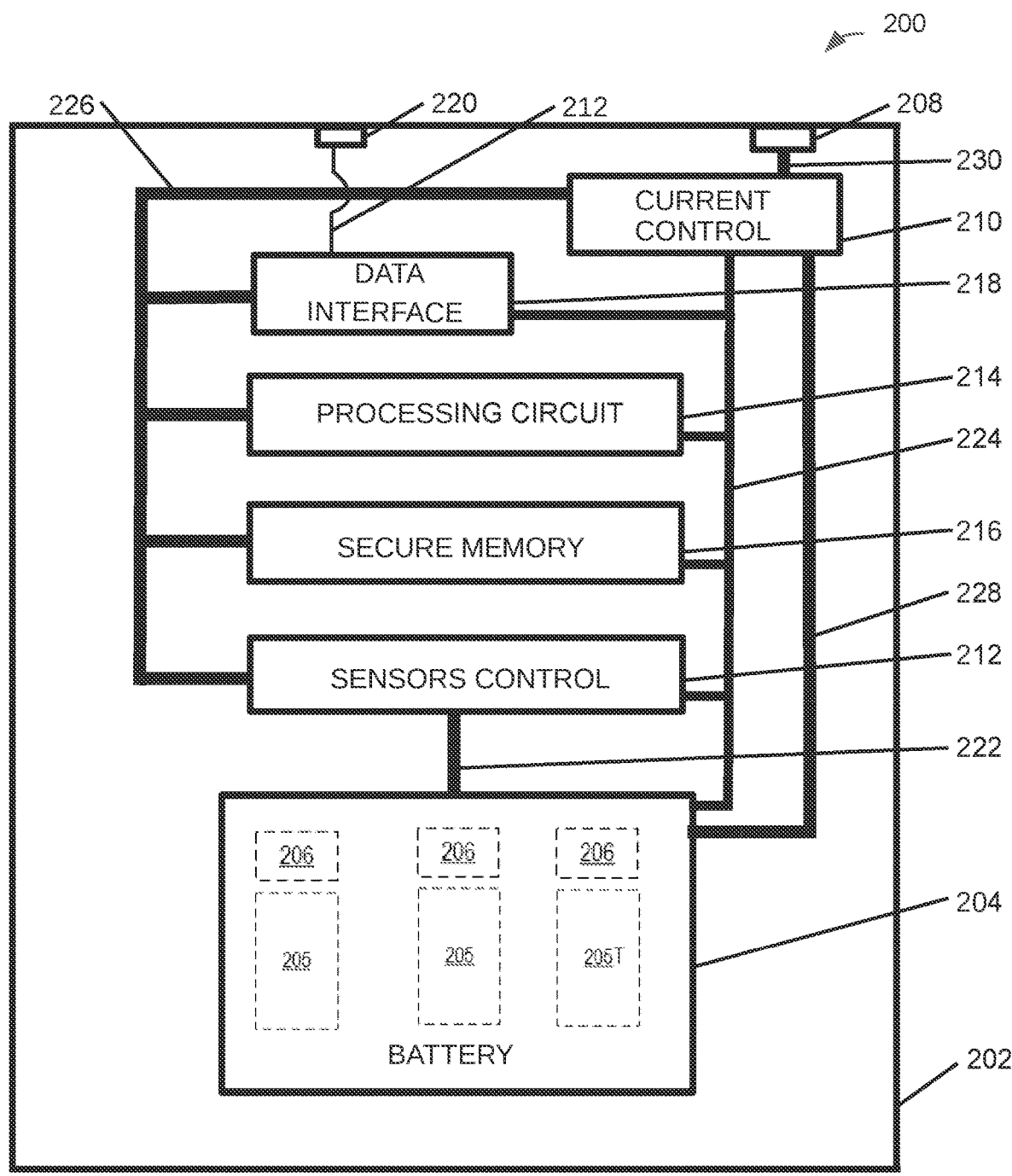
FIG. 1 illustrates an exemplary battery pack according to an embodiment.

Referring now to the drawings, an exemplary embodiment of a battery pack 200 (FIG. 1) and battery exchange station 100 (FIG. 4) will be described. The battery pack 200 and battery exchange station 100 can be used, for example, to implement a battery exchange system. A problem in prior art battery exchange systems is the inability to accurately track battery wear during the useful life of the battery. This inability to account for battery wear remains an obstacle to widespread adoption of battery exchange systems. Every kilowatt hour (kWh) stored and withdrawn from a battery causes some battery wear because the chemical constituents do not all always return to their original configuration after a charge-discharge cycle. The wear rate is highly dependent on how the battery is used. Temperature, state of charge, and charge and discharge current levels are all known to effect battery wear rates by as much as a factor of ten or more. Use is under the control of the battery renter while the cost of wear is borne by the battery owner. Battery renting is a risky venture unless the variable cost of wear can be accounted for.

As an illustration of the relative importance of battery wear costs consider the following example using battery costs and wear numbers consistent with current trends projected a few years into the future. For example, assume that the rechargeable battery initial cost be $150 per kWh of storage capacity with a residual value of $50 per kWh of capacity after it is worn down too much for further prime vehicle use. When capacity is no longer sufficient for prime vehicle use, it still will likely be useful for utility load leveling, storage of intermittent energy from solar or wind, or rental as a lower grade vehicle battery. The battery would deliver 1500 charge-discharge cycles during its normal wear life at moderate temperatures and cycling between 10% and 90% capacity. Thus, during its normal life, the average capital value of a battery pack would be $100 per kWh of capacity and deliver 0.8 kWh per kWh of gross capacity for each cycle. Battery cycling wear would consume $100 worth of battery capital value during its 1500 cycle lifetime. Each kWh delivered from the battery pack thus has a normal wear cost component $0.083=100/(1500×0.8). Charging or discharging at higher than normal currents, at high or low temperatures, and/or outside the 10% to 90% capacity range can increase wear costs by a factor of 10 or more. Compared to a typical $0.12 per kWh cost of the energy passed through the rechargeable battery, the battery wear cost is very significant and increased wear cost from accelerated wear can cost several times the value of the energy. For vehicle users 10 kWh of energy from a battery delivers about the same propulsive energy to the driving wheels as a gallon of gasoline. Thus, for the driver using the projected current battery technology, battery wear cost is equivalent to about $0.83 to over $8.30 per gallon of gasoline for a fuel powered vehicle. Adding the typical $0.12 per kWh energy charge to the battery wear cost, the total cost of battery energy would be in the range of about $2.03 to over $9.50 for 10 kWh delivering the useful energy equivalent to a gallon of gasoline. If the battery pack is recharged at home with off peak electricity costing $0.06 per kWh, the cost per 10 kWh from the battery could be as low as $1.43.

Battery owners can be compensated with rent for the capital value of their rental property. A battery pack with a 25 kWh capacity would be worth on average $2500 during its lifetime using the projected numbers above. At 12% return to the owner, a pack would cost the renter $25 rent per month for continuous use. Renters using these battery packs for long trips could expect to pay about $1.67 rent per day assuming that the packs are in use only half the days available in a year. Rent would be in addition to energy and battery wear charges. Renting several battery packs would be very similar financially to renting a car. Renters with good credit could secure the contract with their credit cards. Others could set up an account secured by a deed of trust on the vehicle at the time of purchase. Continuous renters could be billed an assumed normal monthly wear charge added to the rent with an accurate reckoning when battery packs 200 are swapped periodically or when battery wear data is sent to the battery exchange station 100.

The methods and apparatus disclosed herein enable transfer of rental battery wear costs to the renter. In one embodiment, rental costs comprise three components. The first component is a conventional rent charge for use of the capital value of the battery. The second component is a charge for the energy supplied to the renter. The third component is a variable charge for the wear cost imposed by battery use. Wear cost is determined from measured and recorded wear accelerating stress parameters such as state of charge, voltage, current levels, and temperature.

A renter can be provided with one or more options for charging battery wear costs. In one embodiment, the renter can elect between a fixed wear cost mode and a variable wear cost mode. In the fixed wear cost mode, the battery wear costs comprises a predetermined cost per kWh based on normal or average usage patterns. When the fixed wear cost mode is selected, the user is given a high wear rate allotment. The high wear rate allotment is a budgeted amount of high wear rate operation based on average usage patterns. The fixed wear cost mode limits battery use to limit high wear situations and reduce wear to some predictable average level with a corresponding average wear charge per kWh. For example, the battery pack 200 may limit the total operating time above a threshold current for the fixed wear cost mode. The battery pack 200 can output warning messages to the driver in fixed wear costs mode, which could be either audible or visual warnings, to warn the driver when high current operation is limited. The variable wear cost mode determines battery wear cost based on the stress parameters and displays the instantaneous cost of energy plus wear to let the driver control battery wear stress and rental cost. The variable wear cost mode lets the user control those costs.

When fixed wear cost mode is selected, the high wear rate allotment will sometimes be exhausted. There are several ways this situation can be handled. One approach is to limit or prevent high wear operation once the high wear rate allotment is used while issuing a driver warning. For example, current levels in and out of a battery pack can be limited once the high wear rate allotment is exhausted. Another staged method is to reduce the maximum allowable wear rate in steps as the user gets closer to the high wear rate limit. For example, the maximum allowable current can be reduced by a fixed percentage (e.g., 20%) when 80% of the high wear rate allotment is used and then reduced further when the high wear rate limit is reached. A variation of this approach is to gradually reduce a maximum allowable wear rate as allotment exhaustion approaches and issue a driver warning. Limiting high wear rate operation depending on the remaining allotment for high wear rate operation extends the amount of time that high wear rate operations can continue and allows the driver time to adjust to the limitations on high wear rate operation.

A different approach is to switch operation modes from fixed wear cost to variable wear cost and issue a driver warning. The driver can be warned about an impending change in the operation mode before the high wear rate limit is reached and warned again when the operation mode is switched. The mode switching method has the advantage of imposing no limits on battery power at an inconvenient time, such as a passing or merging maneuver needing maximum available power. A further variation is to automatically terminate the recently entered variable wear cost mode after perhaps a minute of normal wear rate operation to avoid excessive surprise billing for high wear when the user has chosen the fixed wear cost mode. In some embodiments, the user may be given the option to remain in fixed wear cost mode or to change to variable wear cost mode. If the user elects to remain in fixed wear cost mode, high wear rate operation can be limited as described above. In some embodiments, the default option in case no user input is received is to switch operation modes, i.e. the user must explicitly reject the change. In other embodiments, the default option in case no user input is received is to remain in fixed wear cost mode, i.e. the user must explicitly accept the change.

If the wear cost mode has been switched from fixed wear cost mode to variable cost wear cost mode, it can be switched back to fixed wear cost mode by recharging the battery pack to add additional kWh. Each kWh of energy added in the fixed wear cost mode adds to the high wear allotment. Thus, adding kWh resets the high wear allotment to permit continued operation in the fixed wear cost mode. Recharge kWh can come from energy sources external to the vehicle or from regenerative braking. If both fixed and variable wear cost modes are used during a rental period, billing for both modes usage is needed.

There may be circumstances in which a battery pack 200 is recharged during a rental period. In this case, the high wear rate allotment can be adjusted automatically based on the amount of energy added to the battery pack 200.

FIG. 1 illustrates an exemplary battery pack 200 for use in a battery exchange system that enables accounting for battery wear. The battery pack 200 comprises a case 202 containing a battery 204, a power interface 208 for coupling the battery pack 200 to the vehicle or charging station, a current control circuit 210 for regulating the current supplied to or from the battery 204 and for supplying power to the other components of the battery pack 200, a sensor control 212 for collecting data from sensors 206 related to energy consumption and accumulated wear on the battery 204, a processing circuit 214 for controlling data collection, processing collected data and communicating with the battery exchange system, memory 216 for storing computer programs and data, a data interface 218 enabling communication between the battery pack 200 and battery exchange system, and a data connection 200 for communicatively connecting the battery pack 200 to the battery exchange system.

The case 202 protects the contents of the battery pack 200 and is of a standardized configuration to mate with vehicles using a standardized interface. The act of latching the battery pack 200 into a vehicle or charging station complete connections to the power interface 208. Additional connections (not shown) may be provided for any required thermal management fluids.

Battery 204 is an assembly of electrochemical cells 205 typically connected in parallel to achieve the desired current and in series to achieve the desired voltage for the complete battery. One or more cells 205 can serve as test cells 205T for monitoring battery wear. Alternatively, the vehicle may include one or more test cells 205T external to the battery pack 200. In some embodiments, the test cells 205T can also be used to power to the vehicle. In other embodiments, the test cells 205T are used solely to monitor battery wear. The battery 204 may include maintenance features such as switching elements to disconnect defective cells 205 and cell balancing capability. As those skilled in the art will recognize, the battery 204 can also have thermal management connections between cells 205 and the thermal management fluids supplied by the vehicle or charging station. The battery 204 also comprises sensors 206 for all parameters significantly effecting battery wear such as cell voltages, charging and discharging battery current, and temperature. The specific sensors 206 required depend on the particular cell design chosen.

Sensor data is read by sensor control 212 through sensor connection 222 and supplied to the remainder of the data handling system via data bus 226. Data collection and sensor control is managed by processing circuit 214 through control bus 224 which contains an address bus, control lines and a low voltage supply connection.

The low voltage supply for the data handling parts comes from a dc-dc converter, which is part of the current control and power supply circuit 210. Current control and power supply circuit 210 also has switching elements to limit charge and discharge currents to control battery wear. Current limiters in the current control and power supply circuit 210 limit high wear operation when the limit set by the battery pack owner is reached. High voltage power is transferred to and from the battery through connection 228. External power for charging or discharging connects through power interface 208 and power line 230. The external voltage at the power interface 208 is not necessarily the same as the battery voltage because current control and power supply circuit 210 may contain a power dc-dc converter or inverter in addition to the low voltage dc-dc converter supplying power to the battery pack 200. Data interface 218 and current control 210 supply the vehicle computer with battery pack data and control means to limit operation as herein described.

The processing circuit 214 reads program code and data from memory 216, receives internal data from sensor control 212, receives external data from data interface 218 via data bus 226, and issues control signals through control bus 224. The processing circuit 214 stores sensor data and the results of calculations of battery wear, battery state of charge (SOC), battery state of health (SOH), sensor data, and time in memory 216 using data bus 226 and control bus 224. In some embodiments, the processing circuit 214 computes the amount of battery wear (e.g., percentage of wear), or battery wear rate (e.g., cost per kWh), at a predetermined measurement interval and stores the amount of battery wear or battery wear rate for each measurement interval in memory 216. In some embodiments, the processing circuit 214 further computes the battery wear cost for the measurement interval based on the battery wear amount or battery wear rate. Processing circuit 214 can store the battery wear cost for each measurement interval in memory 216, and/or may add the battery wear cost for each measurement interval to an accumulated battery wear cost for a usage period (e.g., rental period).

Memory 216 comprises both volatile and non-volatile memory for storing computer program code and data needed by the processing circuit 214 for operation. Memory 216 may comprise any tangible, non-transitory computer-readable storage medium for storing data including electronic, magnetic, optical, electromagnetic, or semiconductor data storage. Those skilled in the art will recognize that the memory 216 must be secure to protect program and data from tampering by battery pack renters since it holds wear cost information for which they will be billed.

The processing circuit 214 also outputs selected data and calculation results to external users through data interface 218. Data interface 218 comprises a circuit for communicating with the battery exchange system 100, the vehicle, or other external devices. The data interface 218 may comprise a wired or wireless interface. Data interface 218 also enables the battery pack 200 to share data and control signals with the vehicle computer, for example, to display data on the instrument panel or limit certain operations. Data connector 220 provides means for coupling the battery pack 200 to the outside world to enable the communication of data. Connector 220 can be adapted to the data communication format being employed. For wired communications, the data interface 218 may comprise a serial interface (e.g. USB interface) or Ethernet interface and the data connector 220 may comprise a serial port or Ethernet port. For optical communications, connector 220 may be an optical fiber connector. For wireless communications, the data interface may comprise a cellular radio interface (e.g., LTE or 5G), BLUETOOTH® interface, or wireless local area network (WLAN) interface and the data connector 220 may comprise an RF antenna or antenna array. For wired interfaces, the data connection would be completed with the vehicle by inserting and latching the battery pack in place. If the data connection is the antenna of a wireless data transfer system then it functions without mechanical latching. A wireless data transfer system has the further advantage that battery packs 200 can be monitored when they are on storage racks before or after recharging.

Figure 2:
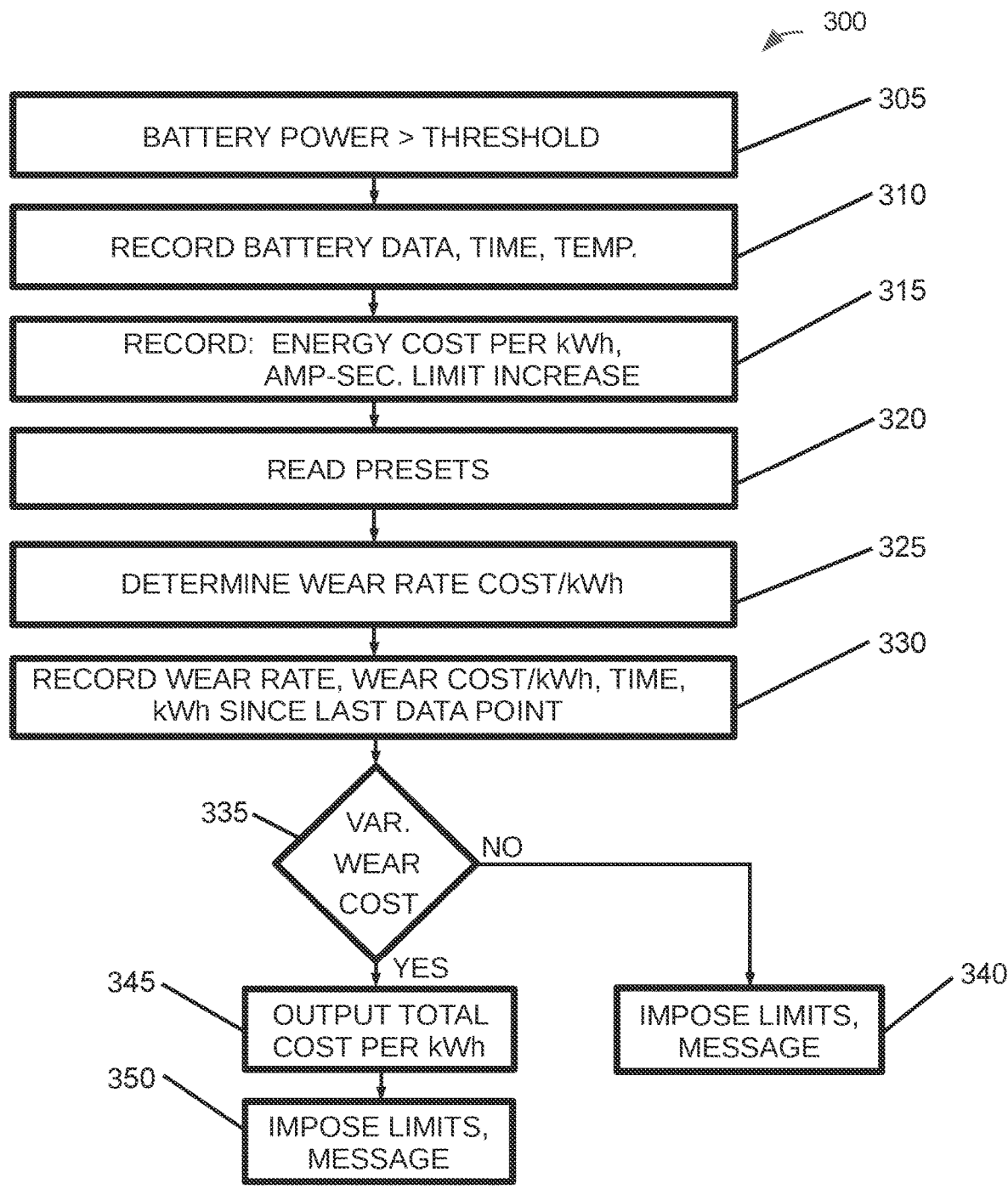
FIG. 2 illustrates a method implemented in a battery pack according to an embodiment.

FIG. 2 illustrates an exemplary process 300 implemented by a battery pack 200 when installed in a vehicle. The process begins when battery current flow exceeding the value required to maintain battery pack standby is detected, indicating that the battery is either being charged or discharged by the vehicle (305). The processing circuit 214 in the battery pack 200 reads and records relevant sensor data including at least battery voltage, current, temperature and the time (310). The processing circuit 214 also records the cost per kWh of the energy if the battery 204 is being charged and the kWh received at that cost (315). The cost per kWh would be zero for regenerative braking and otherwise a number received from the vehicle through data connection 220. In some embodiments, the processing circuit 214 adds high power ampere seconds available at a fixed rate per kWh received for each battery pack being recharged through power interface 208. The processing circuit 214 reads vehicle ID, user preset parameters, battery owner preset parameters and battery user preset mode of operation (320). The mode choices are either a predetermined fixed wear charge per kWh or a variable cost with a display of current and average wear costs. Preset parameters can include limits on allowable maximum and minimum state of charge, maximum current limits, operating temperature limits, limits on wear cost per kWh, and whether the user desires a cost per kWh display. Battery owners may want to prohibit operation at extreme currents and temperatures for which accurate wear costs cannot be calculated. They may also limit duration and energy consumption at high wear rates for users choosing a fixed wear cost option. Battery owner preset values would also include the initial state of charge achieved at the most recent swap station charging cycle.

The processing circuit 214 uses the initial state of charge and recorded current and voltages to estimate current state of charge and compute wear cost per kWh based upon state of charge, present current and temperature, and past cycling history (325). In some cases, this computation can be reduced to a mathematical formula to be computed. In other cases, depending on the details of battery chemistry and design, simple formula computation will be inadequate and a lookup table in memory will be necessary to convert the relevant controlling variables into a wear cost number. As those skilled in the art will appreciate, a lookup table gives discrete wear cost numbers for discrete values of controlling variables. Since actual variable values are likely to fall between the discrete table values, the processing circuit 214 can interpolate between the table values. The processing circuit 214 records the wear cost per kWh, time, and kWh since the last data point in secure memory 206 (330).

In some embodiments, the battery pack 200 outputs data to be displayed to the user on the vehicle control panel. In this case, the processing circuit 214 uses the user preset values to determine whether to display kWh cost (335). If the user has chosen a fixed wear cost mode, the battery pack 200 can output warning messages to the driver, which could be either audible or visual warnings (340). Since the fixed wear cost mode permits some high wear operation to support actions such as passing on 2 lane roads, merging with high speed traffic, and regenerative braking, the driver needs to be informed of the remaining high power energy flow available. Without the information, the driver might create a safety hazard by initiating a high power maneuver without enough available high power battery capacity to complete it. Drivers would also need to be informed if battery power in or out is being limited due to extreme temperatures.

If the user has chosen the variable wear cost mode with a cost display, the processing circuit 214 outputs the total cost per kWh for display to the driver (345). Additionally, some warning messages can be provided if present extreme temperatures are imposing limits on battery power flow in or out or if desired operation is outside the limits set by the battery owner due to inability to accurately compute wear costs (350). In some embodiments, the user may choose to limit current or average trip wear costs or give warnings at some predetermined threshold. The energy cost would be on a last in first out basis for situations in which there is more than a single cost for energy. Thus after regenerative breaking the energy cost would be zero until the saved braking energy is consumed and the total cost per kWh displayed would be just the battery wear cost.

Figure 3A:
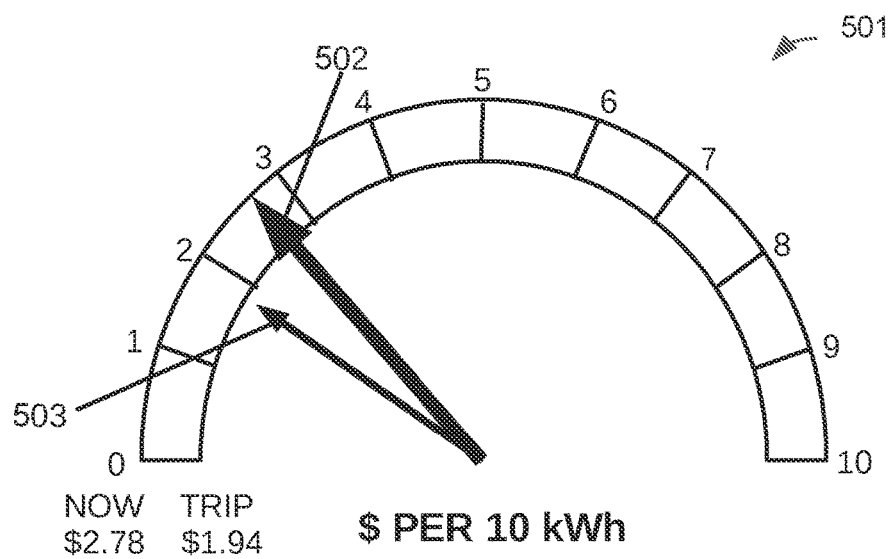
FIGS. 3A-3C show two examples of how energy cost information including battery wear costs and an example of how high wear battery operation could be displayed to drivers.
Figure 3B:
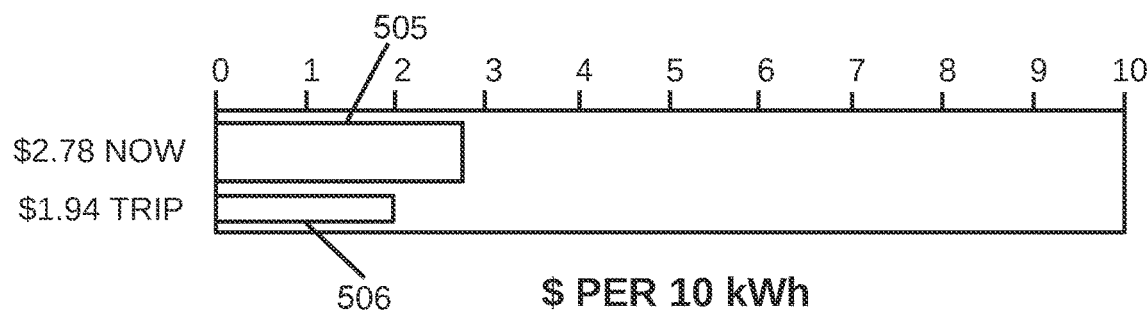
Figure 3C:
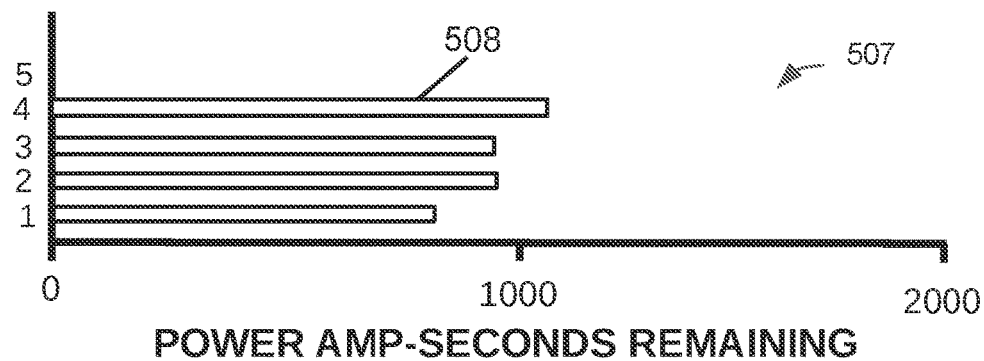

As previously noted, the battery packs 200 can be configured to output data for display to the driver when the vehicle is in use. FIGS. 3A-3C illustrates exemplary displays that can be incorporated into a multifunction display incorporated into the driver's instrument panel. These examples are not the only display configurations which would deliver the relevant information to the driver.

The circular display 501 in FIG. 3A displays the cost per 10 kWh and is similar to familiar speedometer, tachometer, and fuel gauge displays. The display 501 include a first indicator 502 showing the current instantaneous cost and a second indicator 503 showing the average cost for a trip. The instantaneous cost indicator 502 tells the driver how much the current driving situation is costing. The trip cost indicator 503 shows average cost over some travel distance chosen by the driver. The cost per 10 kWh unit is chosen for illustrative purposes because 10 kWh of electrical energy from a battery delivers approximately the same driving wheel propulsive energy as a gallon of gasoline. Thus, this display 501 gives the driver cost information which can easily be compared to a familiar cost unit. The particular unit shown is simply convenient. Any other energy unit such as cost per one kWh could also be used if desired by the driver.

FIG. 3B comprises a bar chart display 504 with two bars. The display 504 includes a first bar 505 showing the current instantaneous cost and a second bar 506 showing the average cost for a trip. The bars 505, 506 can change color to provide additional information. For example, green can be used for low costs, yellow for intermediate costs and red for high costs. Because the bar areas grow in area at the same time as they change color, the bars 505, 506 would be more attention getting. The instantaneous cost displays 502 and 505 tell the driver how much the current driving situation is costing. The trip cost displays 503 and 506 show average cost over some travel distance chosen by the driver.

If the battery pack 200 is charged while the battery pack 200 is installed in a vehicle, the displays 501 and 504 can be used to show any extra wear costs being incurred due to wear acceleration conditions such as high charging currents or extreme temperatures.

The display 507 in FIG. 3C for remaining high wear battery operation shows the number of ampere seconds remaining if delivered at a rate of 10 C, meaning that a fully charged battery would be depleted in 0.1 hour. The preset wear limits set the maximum values displayed. As the battery discharges under occasional high wear conditions, the bars 508 shorten. For the purposes of display, any actual wear rate used to determine rental charges would be normalized to equivalent wear at 10 C and normal temperatures. Each bar 508 shows the remaining accelerated high power wear for each of the installed battery packs. Because battery packs 200 can be exchanged individually, they will not all have the same remaining high current wear.

The cost information for the driver is delivered from the battery packs 200 through data interface 218. If more than one battery pack 200 is in use delivering or absorbing energy the cost data from the several packs should be averaged for the driver.

The battery pack 200 can be part of a modular system wherein multiple battery packs are installed in a battery compartment in the vehicle. The battery compartment can be designed for use with battery packs 200 having different capacities. When a vehicle is equipped with multiple battery packs 200, it may not be desirable to simply discharge all installed battery packs 200 in a vehicle at the same rate. A battery pack 200 which is owned by or on long term lease to a user would not normally be swapped and could be kept charged as a reserve energy source on a trip. The user may prefer that these battery packs 200 be discharged last. Battery packs 200 could also have differing technologies, quality levels, and costs. For maximum economy, lowest cost units could get used preferentially. For maximum performance, all battery packs 200 could be employed to give maximum peak power without exceeding any applicable current limits for any one battery pack 200. On trips during peak travel times when battery packs 200 might be in short supply near the end of the day and rationed, a strategy of fully discharging each battery pack 200 sequentially to minimize the number to be replaced would be attractive. The battery pack 200 may provide the user an interface to select between different usage patterns and strategies. User preference data could be stored in battery packs 200, in some vehicle memory, in the user's cell phone, in some remote storage, or any other data storage accessible by the processor making the automatic recommendation. The data interface 218 and current control provides the vehicle computer with means to selectively discharge battery packs when multiple battery packs 200 are installed.

When returning battery packs 200 for replacement at an exchange station, the user faces several decisions which could be made automatically using driver preference settings and available battery pack condition data. Typical user preferences might include the existence of an installed battery pack 200 which the user owns or has on long term lease and does not want to unload, the minimum number of battery packs 200 needed for local use, the desired maximum distance or time between battery swaps or exchange station, the destination programmed into the vehicle navigation system, the distance remaining to the next planned charger, and the preferred battery pack quality level. These preferences together with battery pack condition data enable a calculation of which particular battery packs 200 to return. The exchange system can obtain the user preference settings for one or more installed battery packs 200 and automatically select on or more installed battery packs 200 to be returned based on the battery information and the user preference information. Similarly, user preferences and battery pack parameters can be used to automatically select the battery packs 200 to install from the stock at the exchange station. The driver would simply have to authorize the computed result if it is satisfactory or make any needed modifications if needed. User preference data could be stored in battery packs 200, in some vehicle memory, in the user's cell phone, in some remote storage, or any other data storage accessible by the processor making the automatic recommendation.

Figure 4:
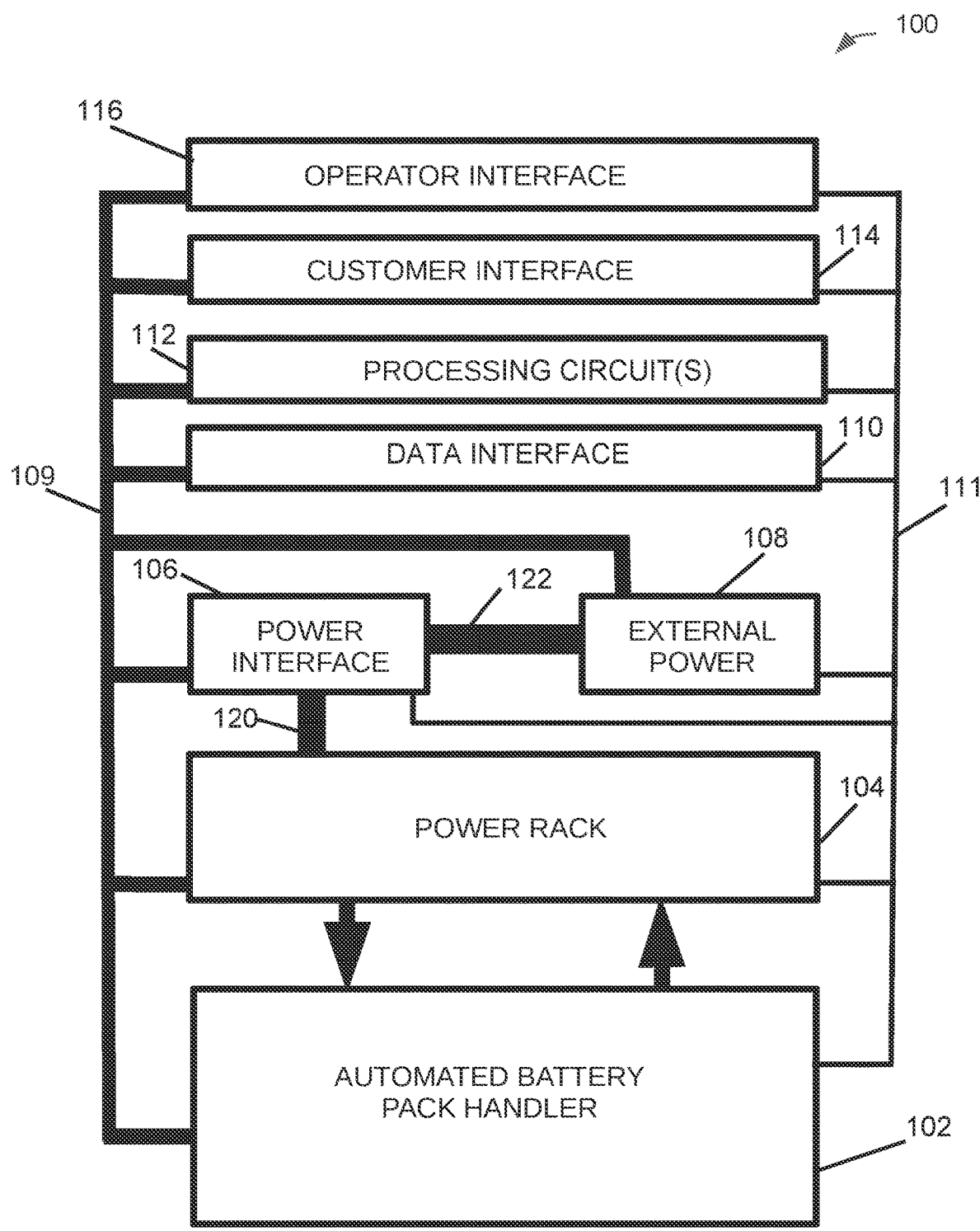
FIG. 4 illustrates an exemplary battery exchange station according to an embodiment.

FIG. 4 illustrates an exemplary battery exchange station 100 for swapping battery packs 200 in a vehicle. The battery exchange station 100 comprises an automated battery pack handler 102 for automatically exchanging the battery packs 200, a power rack 104 for storing, charging and discharging the battery packs 200, a power interface 106 coupling the power rack to external power 108, a data interface 110 for reading data stored in the battery packs 200, a processing circuit 112, a customer interface 114 and an operator interface 116.

The automated battery pack handler 102 is a robotic machine that automates replacement of battery packs 200 in a vehicle. The battery pack handler 102 locates indexing markers on a vehicle, orients itself with the vehicle, and reads vehicle data such as VIN and typical energy consumption per mile. It opens any protective cover on the vehicle battery pack compartment, disconnects power, data, and temperature control connections on any packs to be removed, unfastens and removes any packs to be returned and transfers them to the power rack 104. The battery pack handler 102 reconnects the battery packs 200 placed into the power rack 104 to power, data connections, and temperature control capability in the power rack 104. The battery pack handler 102 then removes the desired number of recharged battery packs 200 from the power rack 104 and installs them in the vehicle. The removal from the power rack 104 and installation in vehicle process require disconnecting all connections to the power rack 104 and reestablishing connections between each battery pack 200 and the vehicle, fastening each battery pack 200 into the vehicle, and closing and fastening any protective covers on the vehicle battery compartment.

The power rack 104 supports the heavy battery packs 200 securely while providing connections for data, power, and temperature control for each battery pack 200. Power interface 106 connects each battery pack 200 to external power 108 to permit battery recharging and also battery use for utility grid load leveling and spinning reserve. Both load leveling and spinning reserve are very valuable to power grid economics and stability. Load leveling reduces grid peak power use while adding off peak load to more fully utilize the system while avoiding overloads. Battery packs 200 can supply power during peak times and be recharged off peak. Spinning reserve is a name given to the capability of a power grid to compensate for a large loss of generation in a few milliseconds to prevent system outages. In the past grid operators actually kept generators spinning at less than full power to provide this nearly instant compensation. Now they supplement actual spinning reserve with controlled load shedding and other rapidly starting power sources such as batteries. Both load leveling and spinning reserve provide a significant potential revenue source from unrented batteries in the power rack. The power interface 106 needs to be bidirectional to realize this revenue. Bidirectional means DC power out and in on the battery connection 120 and AC power in and out on the power grid and external power connection 122. The external power 108 could be some combination of grid power, local renewable energy, and fuel fired peaking generation.

Data interface 110 enables the exchange station 100 to communicate with the battery packs 200, the vehicle or other external devices as well as the power rack 104 using wired or wireless technologies. In vehicle battery data could be collected through a wired or optical connection placed by the automated battery pack handler 102 as part of the exchange process. In vehicle data could also be collected wirelessly using any of several wireless communication protocols. Since most vehicles are cell phone linked via BLUETOOTH® that may be the preferred wireless data transfer means. Cell phone data transfer would permit convenient data collection and monthly billing for battery packs on long term rental which are recharged by users and not swapped.

Processing circuit 112 contains a CPU and memory to receive battery pack data, renter and station operator data inputs, external power data inputs over data bus 109 and processes the data. Output display data is supplied to both users and operators. Billing information is generated based upon battery pack usage time, wear sustained, and energy supplied and sent to customers. Control outputs are sent on control bus 111 to operate the battery exchange station 100. Battery pack data collected can also be processed to estimate when a particular battery pack 200 should be removed from its current service level, sent for repair, diverted to static energy storage, or scrapped.

Customer interface 114 supplies the customer with progress information during the swap process. It also gives billing information and lets the renter designate which battery packs 200 are to be removed and how many are to be installed. If a customer is a few miles from the end of a trip, there would be no reason to replace all the exhausted long trip battery packs 200. Also, a renter may have a long term rental battery pack 200 for local use and could want to keep it as a known familiar quantity rather than take whatever is next in the power rack 104.

The operator interface 116 supplies the station operator with necessary information such as power rack battery inventory and charge condition, external power conditions, customer wait times, and customer behavior.

Those skilled in that art will appreciate that not all of the elements in FIG. 4 need to be in the same location. A remote operator could monitor several stations. The processing circuit 112 could be distributed with station functions handled at the station, operator functions handled near the operator, and billing handled from a central office.

Figure 5:
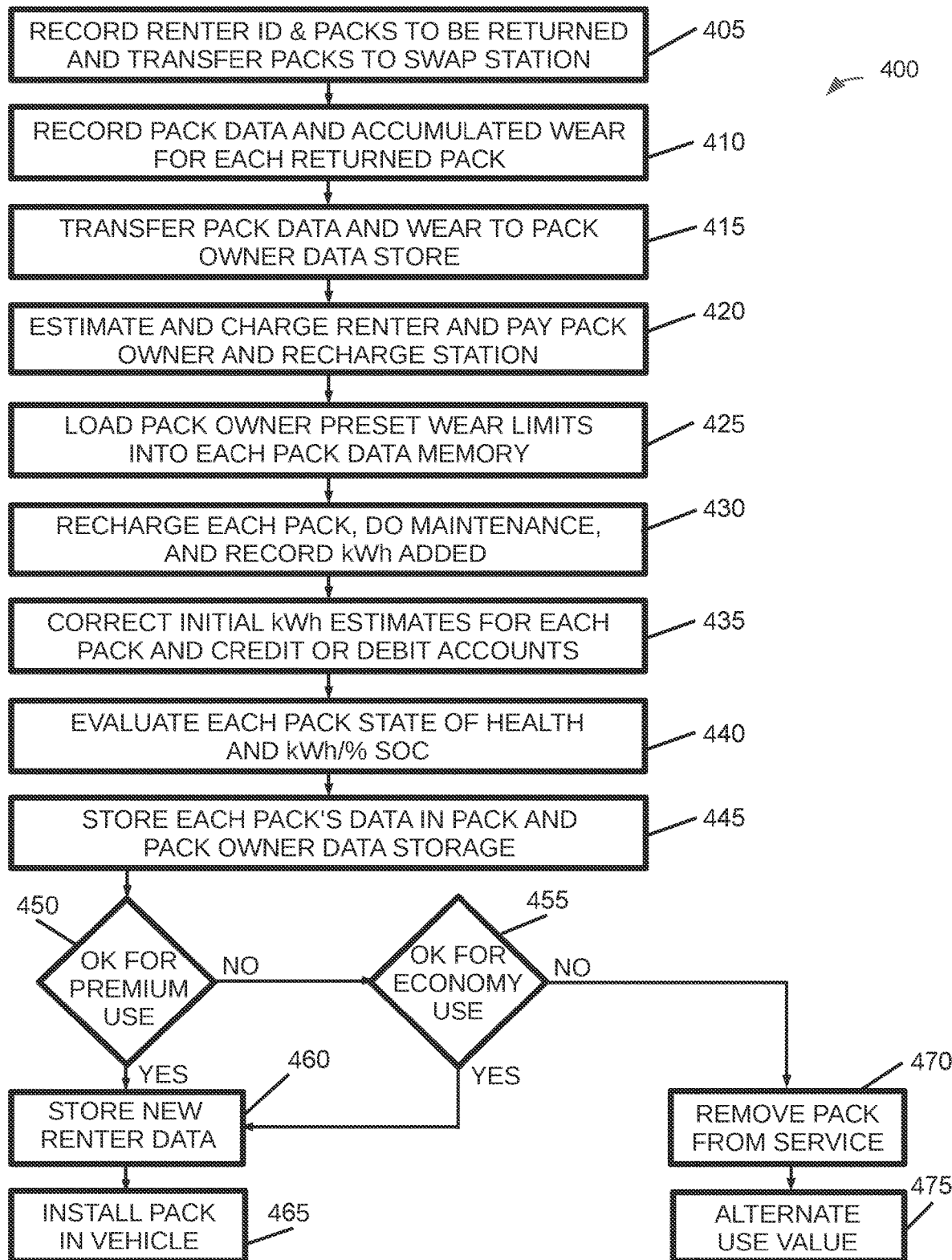
FIG. 5 illustrates a method implemented by a battery exchange station according to an embodiment.

FIG. 5 illustrates an exemplary process 400 implemented by processing circuit 112 when a battery pack 200 is returned to a battery swap station. When the battery pack is detected by the processing circuit, the processing circuit reads the renter identification and directs billing to the correct account (405). If more than one battery pack is in use, they will probably be discharged sequentially as the user drives. Thus, only the depleted packs will need to be returned and some or all replaced with recharged packs. This step transfers the desired battery packs from the vehicle to the recharge station. In one embodiment, the processing circuit 112 obtains, via the battery pack interface, battery information. the processing circuit 112 further obtain user preference information for one or more installed battery packs 200. The user preference information can be obtained from the battery pack, from the vehicle computer, or some other source. The processing circuit 112 automatically selects one or more installed battery packs to be returned based on the battery information and the user preference information.

The processing circuit 112 records the battery pack identifying number, use history, return date and time, wear added during the just completed rental period, and accumulated wear for each returned pack (410). In one embodiment, the processing circuit 112 obtains, via the battery pack interface, battery wear information stored in the each returned battery pack 200. The battery wear information may comprise, for example, information indicative of battery wear during a usage period. The processing circuit 112 determines a wear cost mode for one or more time periods during the usage period. Based on the wear cost mode, the processing circuit 112 determines a battery wear cost for the usage period and the wear cost mode(s) for the one or more time periods. For time periods using the fixed wear cost mode, the battery information indicative of battery wear comprises a battery wear cost per unit of energy delivered by the battery (e.g., per kWh) and an amount of energy delivered by the battery over the time period. For time periods where variable wear cost mode is used, the battery information indicative of battery wear comprises data indicative of an amount of battery wear, battery wear rate, or both.

The processing circuit records the data acquired to a data store for the owner of each battery pack (415). It is likely that if there are several battery packs 200 in a vehicle, they come from more than one battery pack owner. The exchange system may maintain separate data stores for each owner or may maintain a single data store for all owners.

The processing circuit 112 charges the renter's account for energy estimated to recharge each returned pack, wear costs for each returned battery pack 200, and the time charge for use of the capital value for the interval between rental and return (420). The recharge station is credited with the kWh energy charge. Battery pack owners are credited with each time rental charge and wear cost charges for each unit returned.

Owner-defined wear parameter limits and recharge limits are loaded into each battery pack memory (425). These numbers are individualized by battery pack because not all will necessarily have the same design or battery chemistry. As batteries age, the required limiting values for parameters such as charge current, recharge current, and temperature may change. Limits on operating parameters serve to limit wear rates for the fixed wear charge operating mode and keep operations out of extreme situations beyond the limits of accurate wear rate determination.

The processing circuit 112 recharges the battery pack 200 to return the battery pack to the desired maximum state of charge and is an opportunity for routine maintenance such as cell balancing to approximately equalize the state of charge of the individual cells 205 (430). Other maintenance functions such as fluid replenishment, dendrite removal, or defective cell replacement can also be done at this time. Maintenance may require temporarily attaching or inserting sensors or other implements to or into the battery pack 200. The maintenance specifics depend upon the particular cell chemistry and design employed in the battery pack 200. The actual kWh used to recharge the battery pack 200, the state of charge achieved, and the cost per kWh is recorded for accounting purposes.

After recharging is complete a final accounting is made of the actual kWh used to recharge each battery pack 200 to the original state of charge at the start of the rental period (435). The final accounting is used credit or debit the accounts of the renter and the recharging station.

The processing circuit 112 may also evaluate the battery pack quality and capacity after the battery pack 200 is returned (440). Capacity can be determined from the kWh used to achieve each 1 percent increase in the state of charge. Energy needed per each 1 percent increase in state of charge can be determined from the beginning and ending state of charge and the energy used for recharging. Battery state of health determination can use variations between individual cell parameters and the internal resistance of the overall battery to estimate health. Accumulated wear would be a significant predictor of reliability. Other parameters such as temperatures during the charge cycle may be useful depending on the cell chemistry and design. The battery pack owner and the next battery pack renter are informed of the battery pack state of health, kWh per percent increase in state of charge, and state of charge to determine the kWh available to the next renter by storing those values in the battery pack memory and also sending them to the battery pack owner (445).

The processing circuit 112 sorts the battery packs 200 sorted according to quality (450, 455). The highest quality battery packs 200 with the least loss in capability due to wear are identified and designated for premium use (450). Battery packs 200 that are somewhat worn but still adequate for rental use in vehicles are also identified and designated for economy use (455). Packs suitable for vehicle use would be stored until rented to the next user. If the battery packs 200 remain in service, the battery information can be updated by the rental computer system to reflect any changes in capacity or costs (460). When the battery pack 200 is rented, the battery pack 200 is installed in another vehicle and the process of FIG. 2 is performed (465). Battery packs 200 that do not qualify for premium use or economy use are removed from service (470). Battery packs may be retired from use due to factors such as lack of kWh capacity, inadequate peak current capability for acceleration and regenerative braking, or probable unreliability. The retired battery pack 200 can be sold or used for some alternative purpose and revenue realized can be credited to the owner's account (475). For example, the battery pack 200 could be sold for some alternative use such as utility load leveling or storage of intermittent solar or wind energy. Battery packs 200 removed from vehicle service may also find a market powering fast chargers for vehicle batteries. Fast chargers require large peak powers which place a high demand on the utility power system. Utilities impose demand charges to recover their costs. Inexpensive batteries remove this barrier to fast charging which may be necessary if the supply of fully recharged rental battery packs runs low during peak travel times. It would permit returned packs to be quickly recharged and returned to service without waiting for an overnight charge cycle. The same inexpensive worn batteries used for load leveling could also be used for fast chargers since peak holiday travel times usually coincide with light utility system loads. The charge station owner thus reduces the required inventory of rentable vehicle batteries while still benefiting from utility load leveling revenue.

The embodiments shown here are not intended to be limited and those skilled in the art will appreciate that many variations are possible. For example, a battery pack 200 could be created to self-monitor its wear and report it. Self-wear monitoring could be achieved with an electrochemical indicator or with a specialized electronic microchip. An electrochemical indicator might for example be an increase in internal cell resistance or some chemical memory based on electroplating within one or more test cells 205T in the battery pack 200 or vehicle. The specific order of the steps shown can also be altered. For example, the conversion of battery wear stress parameter data into a wear estimate could be done external to the battery pack 200 in the vehicle or at some location such as a swap station where the use history could be used to estimate wear. External wear calculations would be more complex since they would have to handle all variations of cell designs in use. Another embodiment could move the required sensors and data collection outside the casing of the battery pack. Battery current, voltage, and temperature could for example be measured with sensors in the vehicle but outside the battery pack. Other battery wear indicating parameters such as vehicle velocities and accelerations could also be measured by sensors either inside or outside the battery case. The measurement interval for repeated stress parameter determinations might be the sampling rate for input into a digital computation or the reciprocal of the frequency limit imposed by analog circuit bandwidth.

As another example, battery pack quality could be evaluated earlier in the return process. Further, the sorting of battery packs could be modified to create a continuous range of quality levels with each different quality level having a distinct capital rental charge. For example, 4 battery packs each with 25 kWh full charge capacity would give the same performance as 5 lower quality battery packs each having 20 kWh of full charge capacity. If equal performance is to have equal pricing, the capital rental charge for the lower quality units should be 80% of the rental charge of the higher capacity units.

The flexibility permitted by allowing the renter to choose whether to pay a fixed predetermined wear fee or pay only for the wear actually used provides two distinct ways to compensate the battery owner for wear. The predetermined wear cost embodiment gives the user certainty in wear costs but imposes use restrictions. If the wear is predetermined, battery pack use must be restricted to prevent excessive high wear use. Each recharge kWh could come with some number of ampere seconds of high current use at normal temperatures and much less at high or low temperatures. Thus, drivers would have to ration their use of high acceleration or regenerative braking. Long highway grades with heavy loads could easily exceed the imposed average use limits. In contrast if the variable wear cost is chosen the driver is in full control. Conservative low wear driving could keep wear below the usual average predetermined wear and save money by reducing rental costs. Also, high wear operation would be available whenever the driver needed it and was willing to pay for the additional wear. With the continuous kWh display such as FIG. 3 drivers could adjust their speed on long mountain grades to keep battery wear costs in an acceptable range. Brief periods of high acceleration or regenerative braking would be acceptable because the displayed trip cost per kWh would usually not change much.

Figure 6:
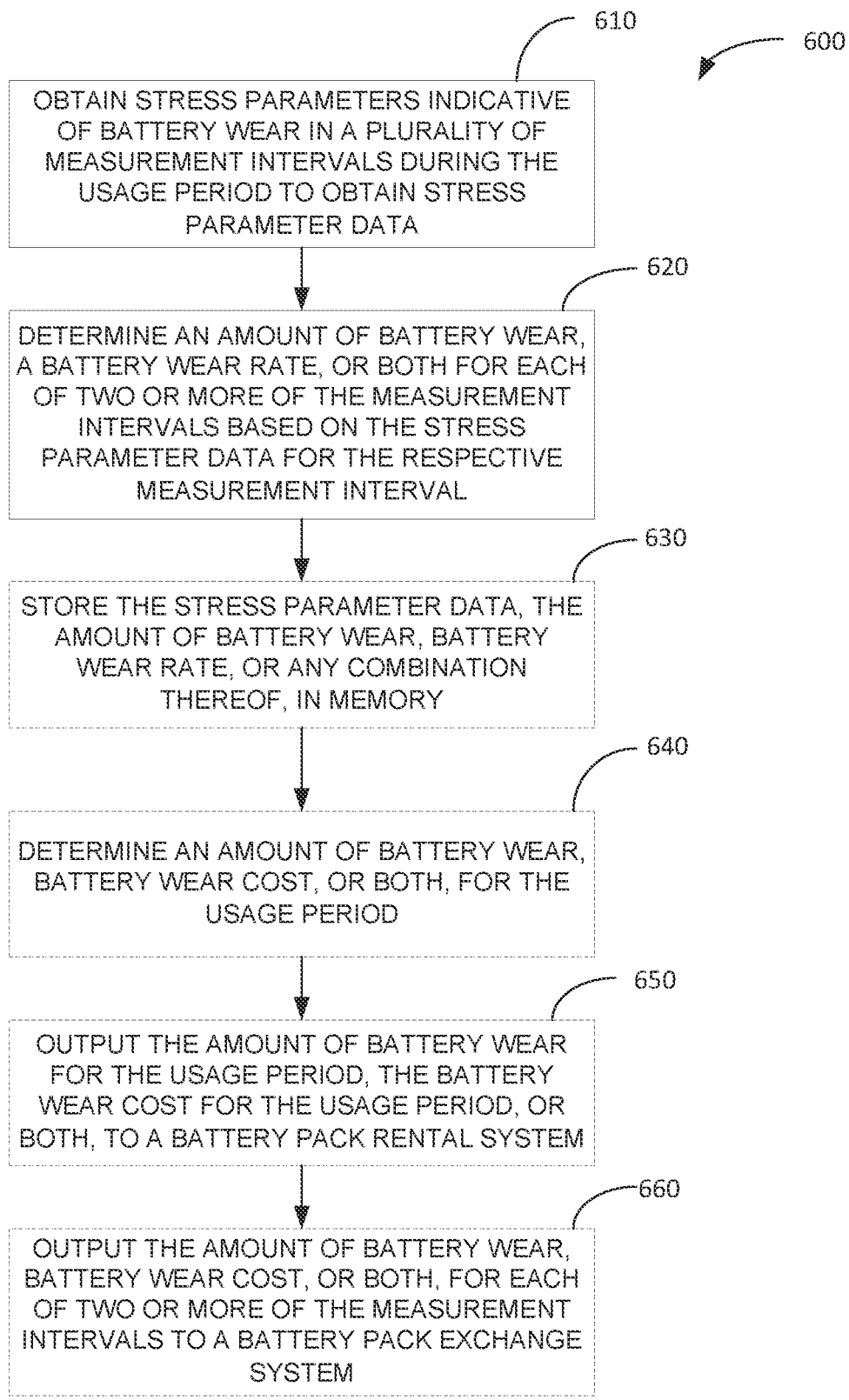
FIG. 6 illustrates an exemplary method of monitoring battery wear implemented by a battery pack or vehicle in which the battery pack is installed.

FIG. 6 illustrates an exemplary method 600 implemented by the battery pack 200 of determining wear on the battery pack during a usage period. It is assumed that the battery pack 200 contains a processing circuit configured to perform the method. Alternatively, the method 600 could be performed by a processing circuit in the vehicle, or by a combination of processing circuit in the battery pack 200 and vehicle. The battery pack 200 and/or vehicle measures one or more stress parameters indicative of battery wear in a plurality of measurement intervals during the usage periods to obtain stress parameter data (610). The battery pack 200 and/or vehicle further determines an amount of battery wear, a battery wear rate, or both for each of two or more of the measurement intervals based on the stress parameter data for the respective measurement interval (620).

In some embodiments of the method 600, the battery pack 200 and/or vehicle detects a high wear rate condition based on the stress parameter data, and limits battery current during the high wear rate condition.

In some embodiments of the method 600, the battery pack 200 and/or vehicle outputs data indicative of the battery wear rate during the usage period for display to a driver of the vehicle.

In some embodiments of the method 600, the battery wear rate comprises determining the battery wear rate using a look-up table.

In some embodiments of the method 600, the stress parameter data includes information related to an electrochemical reaction in at least one cell 205 within said battery pack. In this example, the stress parameter data may comprise measurements of an electrochemical property of the cell.

In some embodiments of the method 600, the battery pack 200 and/or vehicle stores the stress parameter data, the amount of battery wear, battery wear rate, or any combination thereof in an internal memory of the battery pack or vehicle (630).

In some embodiments of the method 600, the battery pack 200 and/or vehicle outputs the stress parameter data, amount of battery wear, battery wear rate, or any combination thereof, to a battery pack exchange system.

In some embodiments of the method 600, the battery pack 200 and/or vehicle determines an amount of battery wear, battery wear cost, or both, for the usage period (640). In one example, the battery pack 200 and/or vehicle determines a battery wear cost for each of two or more measurement intervals and summing the battery wear cost for each of the two or more measurement intervals to obtain the battery wear cost for the usage period. in another example, the battery pack 200 and/or vehicle determines an amount of battery wear for each of two or more measurement intervals and summing the amount of battery wear for the two or more measurement intervals to obtain the amount of battery wear for the usage period.

In some embodiments of the method 600, the battery pack 200 and/or vehicle outputs the amount of battery wear for the usage period, the battery wear cost for the usage period, or both, to a battery pack exchange system (650). In other embodiments, the battery pack 200 and/or vehicle outputs the amount of battery wear, battery wear cost, or both, for each of two or more of the measurement intervals to a battery pack exchange system (660).

Figure 7:
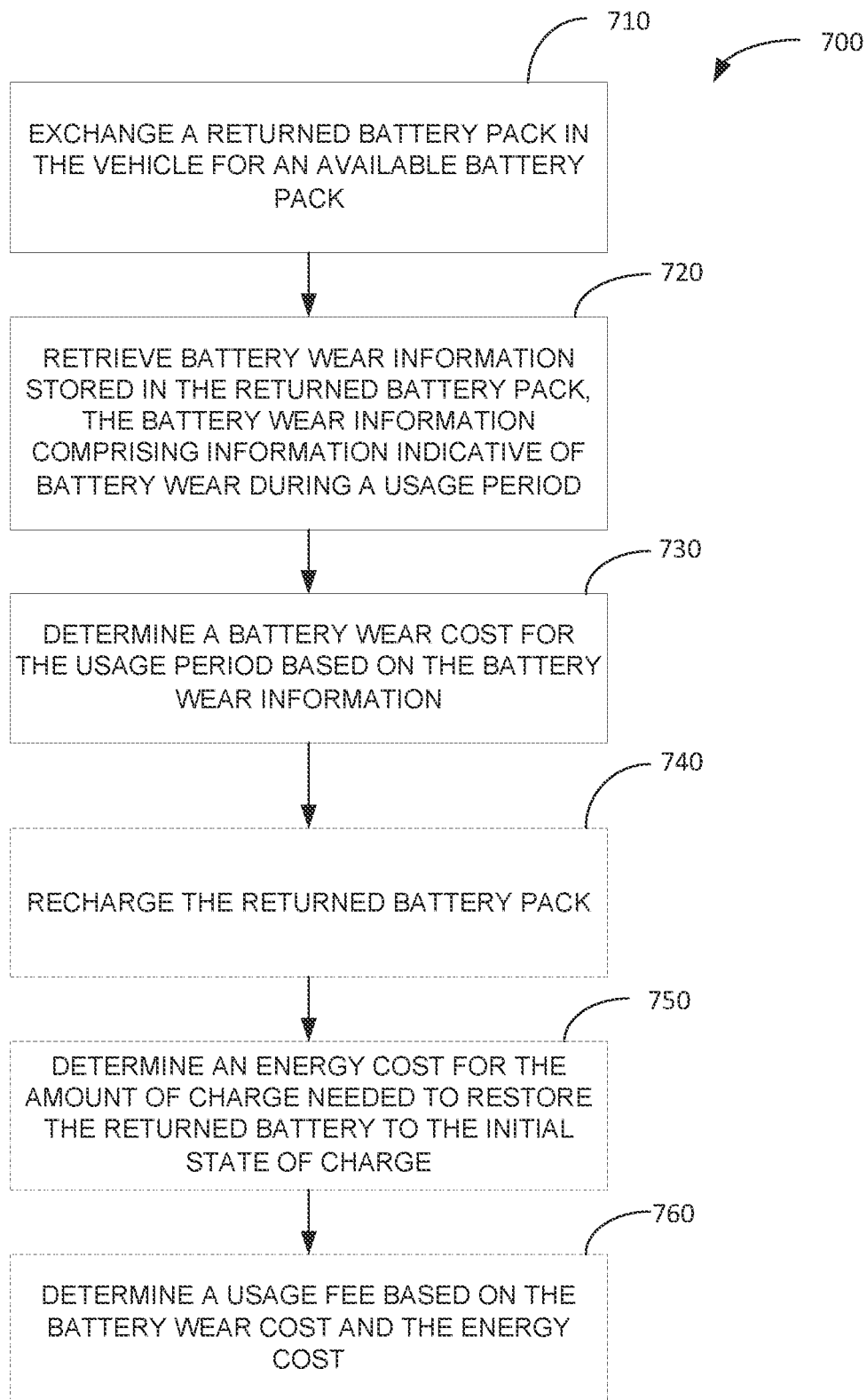
FIG. 7 illustrates an exemplary method of determining battery wear implemented by a battery exchange station.

FIG. 7 illustrates an exemplary method 700 implemented by a battery exchange system 100 according to an embodiment. In one embodiment, the battery exchange system 100 exchanges a returned battery pack in the vehicle for an available battery pack (710) and obtains battery wear information stored in the returned battery pack (720). The battery wear information comprises information indicative of battery wear during a usage period. The battery exchange system 100 further determines a battery wear cost for the usage period based on the battery wear information (730).

In some embodiments of the method 700, the usage period comprises a plurality of measurement intervals and the battery wear information comprises an amount of battery wear, battery wear rate, or both, for each of two or more of the measurement intervals.

In some embodiments of the method 700, battery exchange system 100 determines a battery wear cost for each of the two or more measurement intervals based on the amount of battery wear, battery wear rate, or both, for each of the two or more measurement intervals and sum the battery wear cost for each of the two or more measurement intervals to obtain the battery wear cost for the usage period.

In some embodiments of the method 700, the battery wear information comprises an amount of battery wear, battery wear cost, or both, for the usage period.

Some embodiments of the method 700 further comprises recharging the returned battery to the initial state of charge (740).

Some embodiments of the method 700 further comprises determining an initial state of charge of the returned battery pack at the start of the usage period and determining an amount of charge needed to restore the returned battery to the initial state of charge.

Some embodiments of the method 700 further comprise determining an energy cost for the amount of charge needed to restore the returned battery to the initial state of charge (750).

Some embodiments of the method 700 further comprise determining a usage fee based on the battery wear cost and the energy cost (760).

Although the operations of the methods herein are shown and described in a particular order, the order of the operations of each method may be altered so that certain operations may be performed in an inverse order or so that certain operation may be performed, at least in part, concurrently with other operations. In another example, instructions or sub-operations of distinct operations may be in an intermittent or alternating manner.

The above description of illustrated implementations is not intended to be exhaustive or to limit the scope of the disclosure to the precise forms disclosed. While specific implementations and examples are described herein for illustrative purposes, various equivalent modifications are possible within the scope of the present disclosure, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs.

What is claimed is:

1. A battery exchange system for exchanging battery packs in an electric vehicle configured to operate with multiple, interchangeable battery packs, the battery exchange system comprising:
   a power rack to store one or more available battery packs;
   a battery pack handler for installing and exchanging battery packs in a vehicle;
   a battery pack interface for communicating with installed battery packs in the vehicle; and
   processing circuits configured to:
     determine a wear cost mode for one or more time periods during a usage period, wherein the wear cost mode for each time period is selected from a group comprising a fixed cost mode and a variable cost mode and wherein the wear cost mode for at least one time period of the usage period comprises a fixed cost mode;
     obtain battery wear information indicative of battery wear during the usage period, wherein the battery wear information for the fixed cost mode comprises a battery wear cost per unit of energy and an amount of energy delivered by the battery; and
     determine a battery wear cost for the usage period based on the battery wear information and the wear cost mode for the one or more time periods.

2. The battery exchange system of claim 1 wherein:
   the wear cost mode for at least one time period of the usage period comprises a variable cost mode; and
   the battery wear information for the variable cost mode comprises data indicative of an amount of battery wear, battery wear rate, or both.

3. The battery exchange system of claim 1 wherein the wear cost mode varies between the fixed cost mode and variable cost mode during the usage period.

4. The battery exchange system of claim 3 wherein:
   the wear cost mode comprises a fixed wear cost mode for a first time period of the usage period and a variable wear cost mode for a second time period of the usage period;

the battery wear information for the fixed cost mode comprises a battery wear cost per unit of energy and an amount of energy delivered by the battery; and the battery wear information for the variable cost mode comprises data indicative of an amount of battery wear, battery wear rate, or both.

5. A method of exchanging one or more battery packs in a vehicle configured for use with multiple, interchangeable battery packs, the method comprising:

determining a wear cost mode for one or more time periods during a usage period, wherein the wear cost mode for each time period is selected from a group comprising a fixed cost mode and a variable cost mode and wherein the wear cost mode for at least one time period of the usage period comprises a fixed cost mode;

obtaining battery wear information indicative of battery wear during the usage period, wherein the battery wear information for the fixed cost mode comprises a battery wear cost per unit of energy and an amount of energy delivered by the battery; and determining a battery wear cost for the usage period based on the battery wear information and the wear cost mode for the one or more time periods.

6. The method of claim 5 wherein:

the wear cost mode for at least one time period of the usage period comprises a variable cost mode; and the battery wear information for the variable cost mode comprises data indicative an amount of battery wear, battery wear rate, or both.

7. The method of claim 5 wherein the wear cost mode varies between the fixed cost mode and variable cost mode during the usage period.

8. The method of claim 7 wherein:

the wear cost mode comprises a fixed wear cost mode for a first time period of the usage period and a variable wear cost mode for a second time period of the usage period;

the battery wear information for the fixed cost mode comprises a battery wear cost per unit of energy and an amount of energy delivered by the battery; and the battery wear information for the variable cost mode comprises data indicative of an amount of battery wear, battery wear rate, or both.

* * * * *